(12) United States Patent
Kim et al.

(10) Patent No.: US 8,759,945 B2
(45) Date of Patent: Jun. 24, 2014

(54) FUSE STRUCTURES, E-FUSES COMPRISING FUSE STRUCTURES, AND SEMICONDUCTOR DEVICES COMPRISING E-FUSES

(75) Inventors: Seong-Ho Kim, Seoul (KR); Won-Mo Park, Seongnam-si (KR); Gil-Sub Kim, Suwon-si (KR); Ho-Ju Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 84 days.

(21) Appl. No.: 13/081,949

(22) Filed: Apr. 7, 2011

(65) Prior Publication Data

US 2011/0298086 A1 Dec. 8, 2011

(30) Foreign Application Priority Data

Jun. 3, 2010 (KR) .................. 10-2010-0052327

(51) Int. Cl.
*H01L 23/52* (2006.01)
*H01L 29/00* (2006.01)

(52) U.S. Cl.
USPC ............ 257/529; 257/209; 257/530; 257/528

(58) Field of Classification Search
USPC ................. 257/529, 209, 528, 530, 50, 665
See application file for complete search history.

(56) References Cited

U.S. PATENT DOCUMENTS

| 5,272,666 | A * | 12/1993 | Tsang et al. ..................... 365/96 |
| 6,512,284 | B2 * | 1/2003 | Schulte et al. ................. 438/467 |
| 6,661,330 | B1 * | 12/2003 | Young ............................ 337/297 |
| 7,321,130 | B2 * | 1/2008 | Lung et al. ......................... 257/4 |
| 7,723,820 | B2 * | 5/2010 | Kim et al. ...................... 257/530 |
| 7,781,862 | B2 * | 8/2010 | Bertin et al. .................. 257/529 |
| 2007/0268739 | A1 * | 11/2007 | Yoo et al. ...................... 365/151 |
| 2008/0006903 | A1 * | 1/2008 | Akimoto ....................... 257/529 |
| 2009/0184389 | A1 * | 7/2009 | Bertin et al. .................. 257/476 |

FOREIGN PATENT DOCUMENTS

| JP | 206-049467 | 2/2006 |
| KR | 1020030002123 | 1/2003 |
| KR | 1020090014824 | 2/2009 |

* cited by examiner

*Primary Examiner* — Chuong A. Luu
(74) *Attorney, Agent, or Firm* — Myers Bigel Sibley & Sajovec, P.A.

(57) ABSTRACT

A fuse structure, an e-fuse including the fuse structure and a semiconductor device including the e-fuse are disclosed. The fuse structure includes first and second electrodes extending in a first direction, and spaced a predetermined distance apart from each other and having one ends thereof facing each other, an insulation layer formed between the one end of the first electrode and the one end of the second electrode facing each other, and a conductive film overlapping portions of the first and second electrodes on the insulation layer and contacting the first electrode and the one end of the second electrode.

20 Claims, 9 Drawing Sheets

FUSE STRUCTURES, E-FUSES COMPRISING FUSE STRUCTURES, AND SEMICONDUCTOR DEVICES COMPRISING E-FUSES

CROSS-REFERENCE TO RELATED APPLICATION

This application claims priority under 35 U.S.C. 119 from Korean Patent Application No. 10-2010-0052327 filed on Jun. 3, 2010 in the Korean Intellectual Property Office, the disclosure of which is incorporated herein by reference in its entirety.

BACKGROUND

1. Field of the Invention

The present general inventive concept relates to a fuse structure, an e-fuse comprising the fuse structure and a semiconductor device comprising the e-fuse.

2. Description of the Related Art

In general, a semiconductor device is manufactured by performing a fabrication (FAB) process in which cells having an integrated circuit are formed by repeatedly forming a predetermined circuit pattern on a substrate, and a package assembly process in which the substrate having cells are packaged in units of chips.

In addition, an electrical die sorting (EDS) process for inspecting electrical characteristics of the respective cells is performed between the FAB process and the package assembly process, and defective cells are sorted through the EDS process. Defective cells are replaced by pre-fabricated redundancy cells, so that the device can operate normally, thereby improving the throughput of the semiconductor device manufacturing process. The replacement process is typically performed by cutting a fuse on a wire connected to a defective cell.

SUMMARY

According to some embodiments of the present general inventive concept, there is provided a fuse structure including first and second electrodes extending in a first direction, and spaced a predetermined distance apart from each other and having first ends thereof facing each other, an insulation layer between the first end of the first electrode and the first end of the second electrode, and a conductive film on the insulation layer and contacting the first and second electrodes.

According to further embodiments of the present general inventive concept, there is provided an electronic fuse (e-fuse) including a first lower electrode pattern on a substrate and extending in a first direction, a second lower electrode pattern on the substrate and extending in the first direction and spaced apart from the first lower electrode pattern in the first direction, a dummy electrode pattern extending in parallel with the first and second lower electrode patterns in the first direction, an insulation layer formed on the substrate between the first and second lower electrode patterns, and a conductive film on the insulation layer and contacting the first and second lower electrode patterns.

According to still further embodiments of the present general inventive concept, there is provided a semiconductor device including a substrate having cell array regions and a fuse region therein, a first lower electrode pattern on the fuse region of the substrate and extending in a first direction, a second lower electrode pattern on the fuse region of the substrate and extending in the first direction and spaced apart from the first lower electrode pattern in the first direction, a dummy electrode pattern extending in parallel with the first and second lower electrode patterns in the first direction, an insulation layer on the fuse region of the substrate between the first and second lower electrode patterns, and a fuse conductive film pattern on the insulation layer and contacting the first and second lower electrode patterns.

BRIEF DESCRIPTION OF THE DRAWINGS

The above and other features and advantages of the present general inventive concept will become more apparent by describing in detail preferred embodiments thereof with reference to the attached drawings in which.

DETAILED DESCRIPTION OF THE EMBODIMENTS

Advantages and features of the present general inventive concept and methods of accomplishing the same may be understood more readily by reference to the following detailed description of preferred embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the present general inventive concept will only be defined by the appended claims.

Throughout the drawings and written description, like reference numerals will be used to refer to like or similar elements. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present general inventive concept.

Example embodiments of the present general inventive concept are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present general inventive concept should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, an e-fuse according to a first embodiment of the present general inventive concept will be described with reference to FIGS. 1 through 3.

Figure 1:
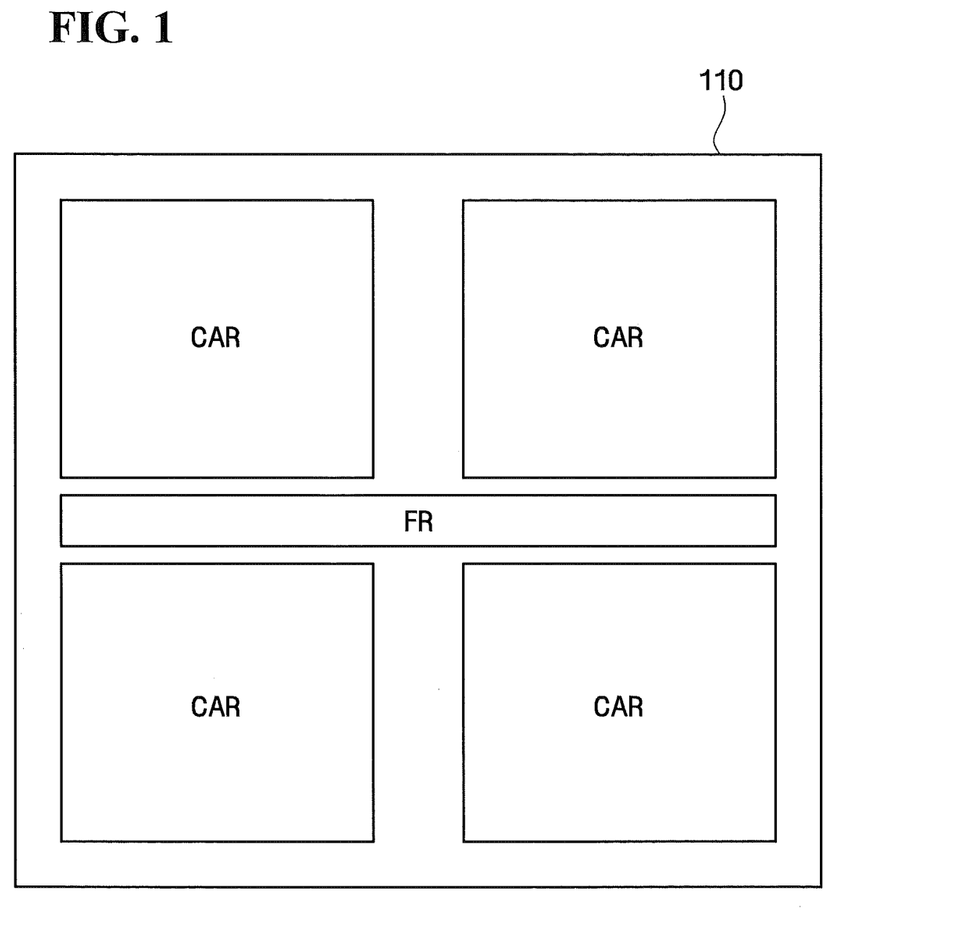
FIG. 1 is a conceptual diagram for explaining cell array regions and a fuse region defined on a substrate of a semiconductor device according to some embodiments of the present general inventive concept.
Figure 2:
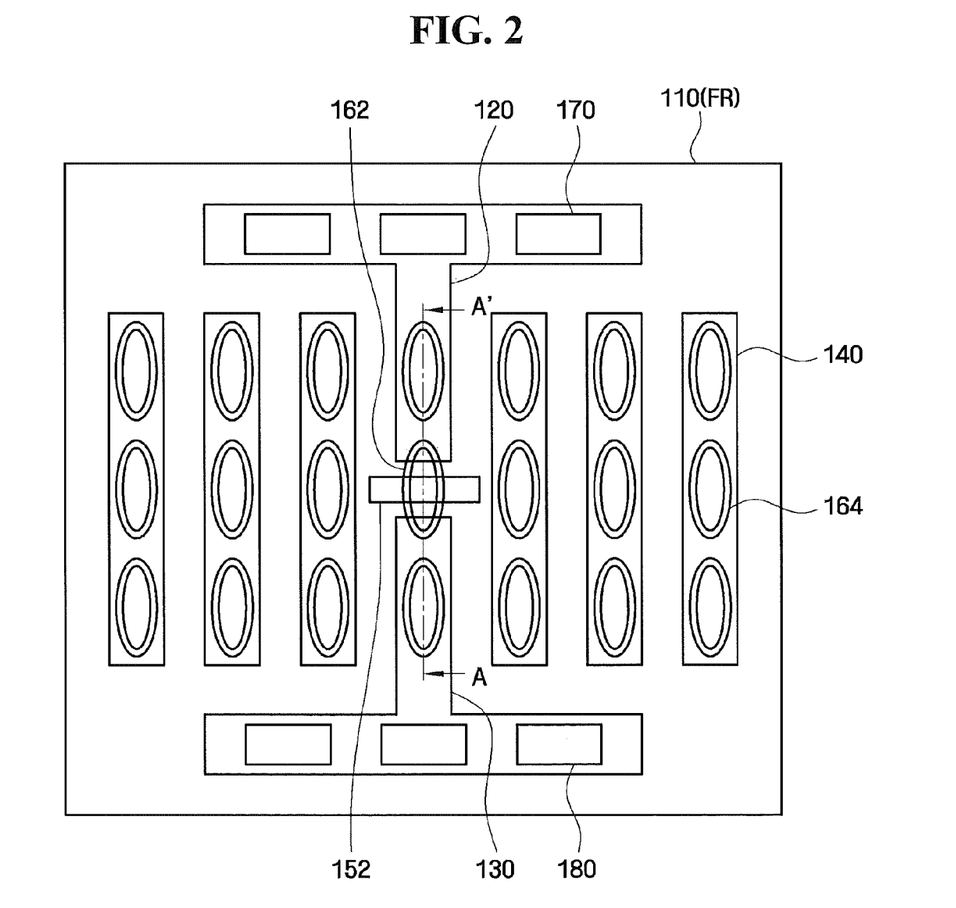
FIG. 2 is a layout view of an e-fuse according to some embodiments of the present general inventive concept.
Figure 3:
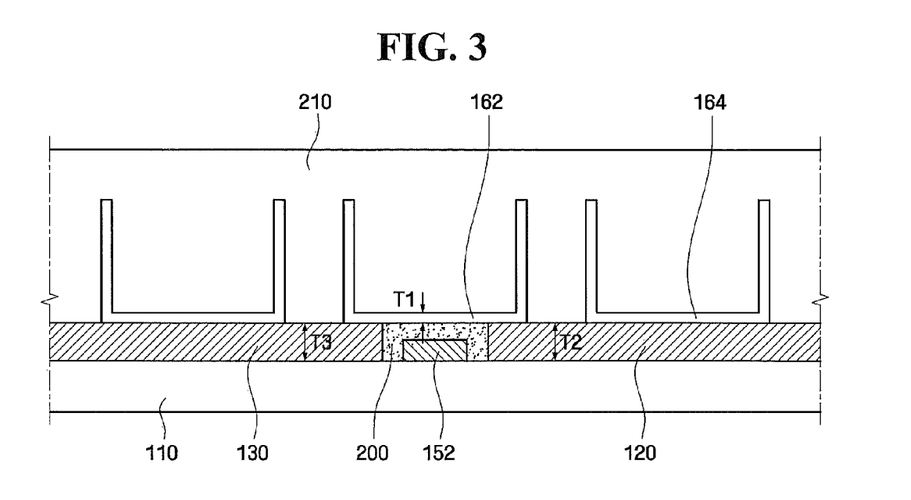
FIG. 3 is a cross-sectional view taken along the line A-A' of FIG. 2.

FIG. 1 is a conceptual diagram for explaining cell array regions and a fuse region defined on a substrate of a semiconductor device according to an embodiment of the present general inventive concept, FIG. 2 is a layout view of an e-fuse according to an embodiment of the present general inventive concept, and FIG. 3 is a cross-sectional view taken along the line A-A' of FIG. 2. In the following description, a memory IC device will be described by way of example of the semiconductor device according to an embodiment of the present general inventive concept, but the invention is not limited thereto.

Referring first to FIG. 1, cell array regions CARs and a fuse region FR are defined in a substrate 110 of the semiconductor device according to an embodiment of the present general inventive concept. First, memory cells that store data may be formed in the CARs, while a plurality of e-fuses used in a repair process if a cell is determined to be defective, and a plurality of pads (170 and 180 of FIG. 2) may be formed in the FR.

The plurality of pads (170 and 180 of FIG. 2) may be used in inputting and outputting a signal, such as a power voltage, a ground voltage, control signals, an address and data when the operation of a semiconductor device is tested.

Next, referring to FIGS. 2 and 3, the e-fuse may include a first lower electrode pattern 120, a second lower electrode pattern 130, a dummy electrode pattern 140, an insulation film 200, a fuse conductive film pattern 162, dummy conductive film patterns 164, a first etch stop pattern 152, a moisture absorption preventing film 210 and metal pads 170 and 180.

As shown in FIG. 2, the first lower electrode pattern 120 may be formed to extend in a first direction (for example, in a longitudinal direction), and the second lower electrode pattern 130 may be formed to extend in the first direction (for example, in the longitudinal direction), so as to be spaced apart from the first lower electrode pattern 120 in the first direction (for example, in the longitudinal direction). That is to say, as shown in FIGS. 2 and 3, one end of the first lower electrode pattern 120 may be opposite to and face one end of the second lower electrode pattern 130 and the one ends of the first and second lower electrode patterns 120 and 130 may be spaced apart from each other in the first direction (for example, in the longitudinal direction).

The insulation film 200 may be formed at a space between the one end of the first lower electrode pattern 120 and the one end of the second lower electrode pattern 130. The insulation film 200 may have the same thickness as the first lower electrode pattern 120 and the second lower electrode pattern 130, as shown in FIG. 3.

The conductive film pattern 162 overlaps portions of the first and second lower electrode patterns 120 and 130 and is formed on the insulation film 200, while contacting the first and second lower electrode patterns 120 and 130.

In the e-fuse according to the embodiment of the present general inventive concept, the conductivity of a material forming the fuse conductive film pattern 162 is lower than that of materials forming the first and second lower electrode patterns 120 and 130. More specifically, in the e-fuse according to the embodiment of the present general inventive concept, the material forming the fuse conductive film pattern 162 may be, for example, titanium nitride (TiN), and the materials forming the first and second lower electrode patterns 120 and 130 may be, for example, tungsten (W) or aluminum (Al).

The dummy electrode pattern 140 may extend in parallel with the first and second lower electrode patterns 120 and 130 in the first direction. The dummy conductive film patterns 164 to be described later may be formed on the dummy electrode pattern 140.

Meanwhile, in the e-fuse according to the embodiment of the present general inventive concept, a thickness T1 of the fuse conductive film pattern 162 may be smaller than thicknesses T2 and T3 of the first and second lower electrode patterns 120 and 130. More specifically, a ratio of the thickness T1 of the fuse conductive film pattern 162 to the thickness T2 or T3 of the first or second lower electrode pattern 120 or 130 may be in a range of 1:50 to 1:10.

In addition, in the e-fuse according to the embodiment of the present general inventive concept, the fuse conductive film pattern 162 may have a U-shaped sectional profile, as shown in FIG. 3. The U-shaped profile of the fuse conductive film pattern 162 is advantageous in that the fuse conductive film pattern 162 can be simultaneously formed in the fuse region FR at the same time when a storage capacitor (not shown) is formed in the cell array region CAR without additionally performing a separate process. The illustrated sectional profile is, however, provided only for illustration of efficient manufacture process and the invention is not limited to the illustrated profile. That is to say, the fuse conductive film pattern 162 may have a different profile if desired.

The dummy conductive film patterns 164 may be formed on the dummy electrode pattern 140. Referring to FIG. 2, all the conductive film patterns shown in FIG. 2, except for the fuse conductive film pattern 162 formed at a space between one end of the first lower electrode pattern 120 and one end of the second lower electrode pattern 130, may be dummy conductive film patterns 164. The dummy conductive film patterns 164 may help to provide structural support for the fuse conductive film pattern 162, e.g., to keep the fuse conductive film pattern 162 from collapsing.

FIG. 2 illustrates that one fuse conductive film pattern 162 is centrally located and the dummy conductive film patterns 164 are formed around the fuse conductive film pattern 162, but aspects of the present invention are not limited thereto. That is to say, two or more of the fuse conductive film pattern 162 may be centrally located, and a greater number of the dummy conductive film patterns 164 than those shown in FIG. 2 may be formed to surround the fuse conductive film pattern 162.

The first etch stop pattern 152 extends in a second direction (for example, in a transverse direction) perpendicular to a first direction (for example, in a longitudinal direction) so as to be disposed between the respective one ends of the first and second lower electrode patterns 120 and 130 spaced apart from each other. The first etch stop pattern 152 may be formed inside the insulation film 200, as shown in FIG. 3, so as not to contact the first and second lower electrode patterns 120 and 130 and the fuse conductive film pattern 162. The first etch stop pattern 152 may serve as an etch stop layers for preventing or inhibiting exterior sides of the fuse conductive film pattern 162 from being etched during patterning of the fuse conductive film pattern 162.

As shown in FIG. 3, the moisture absorption preventing film 210 may be formed on the fuse conductive film pattern 162 and the dummy conductive film patterns 164 so as to surround the fuse conductive film pattern 162 and the dummy conductive film patterns 164. Since the moisture absorption preventing film 210 is formed to surround the fuse conductive film pattern 162, it may prevent or inhibit the fuse conductive film pattern 162 from re-growing according to the surrounding condition once it is cut, which will be described below in describing the operating principle of the e-fuse. If necessary, dielectric films (not shown) may further be formed between each of the moisture absorption preventing film 210, the fuse conductive film pattern 162 and the dummy conductive film patterns 164.

The metal pads 170 and 180 may be electrically connected to the first and second lower electrode patterns 120 and 130 to then be used in inputting and outputting a signal, such as a power voltage, a ground voltage, control signals, an address and data. The metal pads 170 and 180 may include one or more input pads 170 and/or output pads 180, as shown in FIG. 2.

An e-fuse according to another embodiment of the present general inventive concept will now be described with reference to FIGS. 4 and 5.

Figure 4:
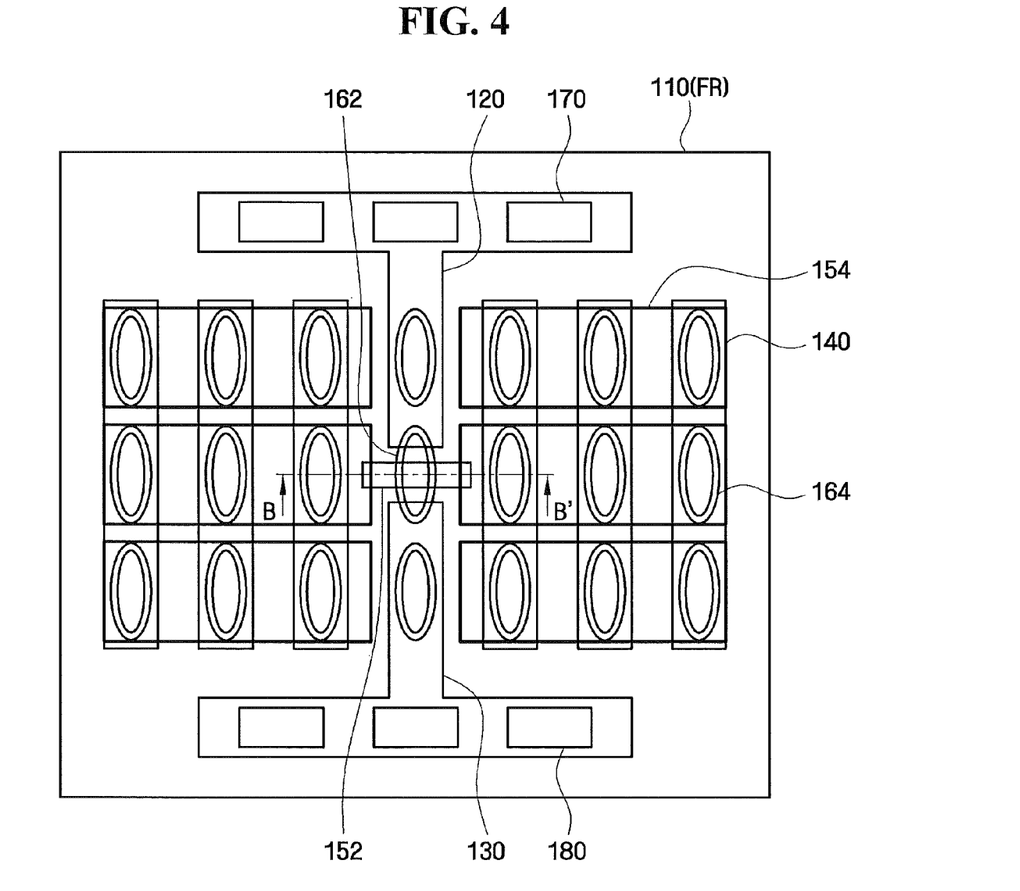
FIG. 4 is a layout view of an e-fuse according to further embodiments of the present general inventive concept.
Figure 5:
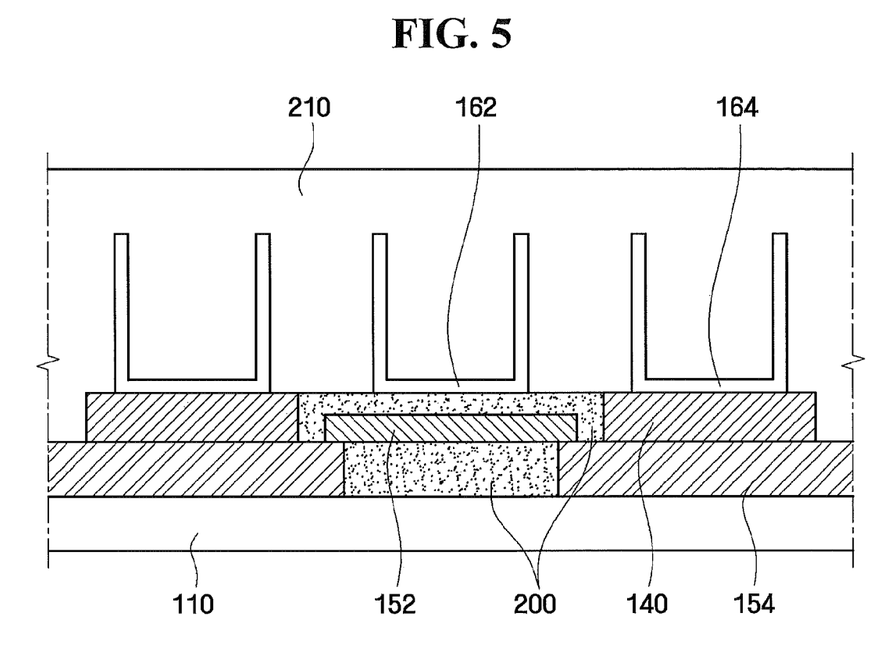
FIG. 5 is a cross-sectional view taken along the line B-B' of FIG. 4.

FIG. 4 is a layout view of an e-fuse according to another embodiment of the present general inventive concept, and FIG. 5 is a cross-sectional view taken along the line B-B' of FIG. 4. In the following description, a detailed description made in describing for the e-fuses according to the previous embodiment of the present general inventive concept will be omitted and only differences between both embodiments will be described.

Referring to FIGS. 4 and 5, the e-fuse may further include second etch stop patterns 154.

The second etch stop patterns 154 may serve as etch stop layers for preventing exterior sides of the dummy conductive film patterns 164 from being etched during patterning of the dummy conductive film patterns 164.

Since a detailed description related to the other components is the same as that made in describing the e-fuse according to the embodiment of the present general inventive concept, the detailed description thereof will be omitted.

The second etch stop patterns 154 may be formed under the dummy electrode pattern 140 to be symmetrical to each other relative to the first and second lower electrode patterns 120 and 130 while contacting the first etch stop pattern 152. More specifically, as shown in FIG. 4, the second etch stop patterns 154 extend in parallel with each other in a second direction (for example, in a transverse direction) perpendicular to the first direction (for example, in a longitudinal direction) so as to intersect the dummy electrode pattern 140. Referring to FIG. 5, the second etch stop patterns 154 are electrically connected to a lower portion of the dummy electrode pattern 140 while being electrically disconnected from first and second lower electrode patterns 120 and 130.

Hereinafter, an e-fuse according to still another embodiment of the present general inventive concept will be described with reference to FIG. 6.

Figure 6:
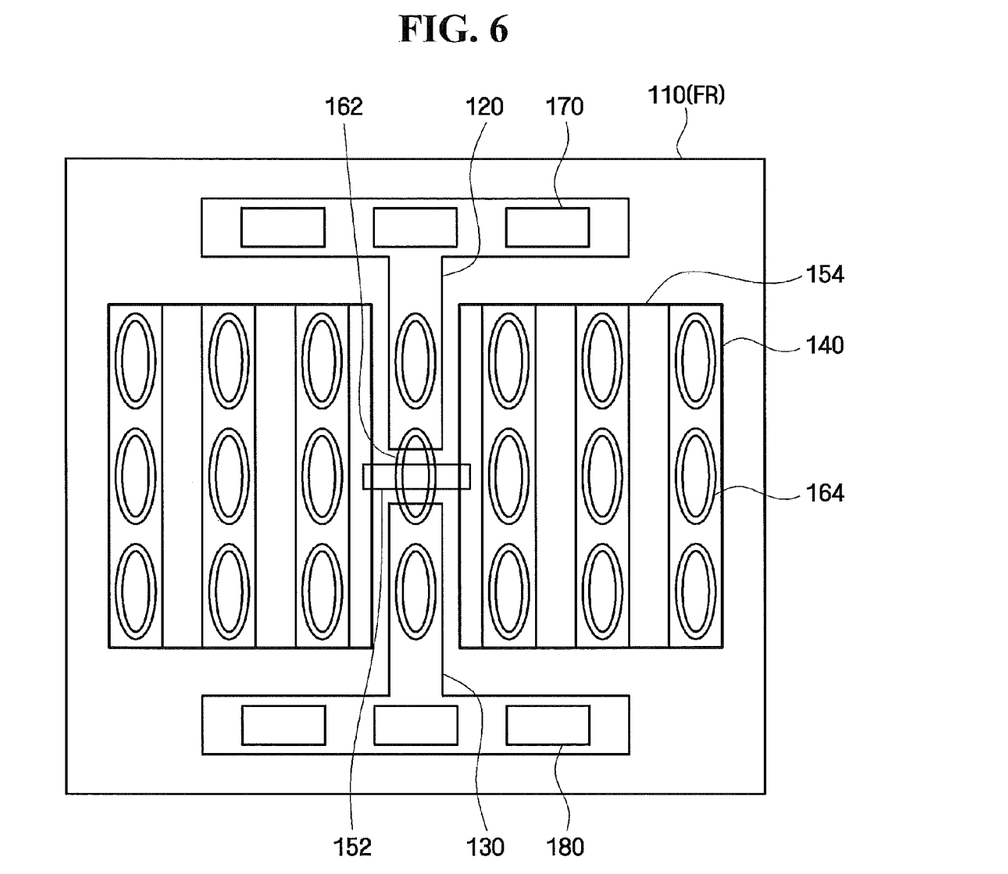
FIG. 6 is a layout view of an e-fuse according to still further embodiments of the present general inventive concept.

FIG. 6 is a layout view of an e-fuse according to still another embodiment of the present general inventive concept. Likewise, in the following description, a detailed description made in describing for the e-fuses according to the previous embodiments of the present general inventive concept will be omitted.

Referring to FIG. 6, in the e-fuse according to the embodiment of the present general inventive concept, the second etch stop patterns 154 are formed under the dummy electrode pattern 140 to be symmetrical to each other in view of the first and second lower electrode patterns 120 and 130 while being shaped of a plate contacting the first etch stop pattern 152. More specifically, as shown in FIG. 6, the second etch stop patterns 154 may be formed on the entire bottom surface of the dummy electrode pattern 140 so as to be symmetrical with each other in view of the first and second lower electrode patterns 120 and 130. That is to say, the second etch stop patterns 154 connected to the first etch stop pattern 152 may be formed in a dumbbell shape.

Since a detailed description related to the other components is the same as that made in describing the e-fuse according to the previous embodiments of the present general inventive concept, the detailed description thereof will be omitted.

Next, the operating principle and characteristics of an e-fuse according to embodiments of the present general inventive concept will be described with reference to FIGS. 7 through 9.

Figure 7:
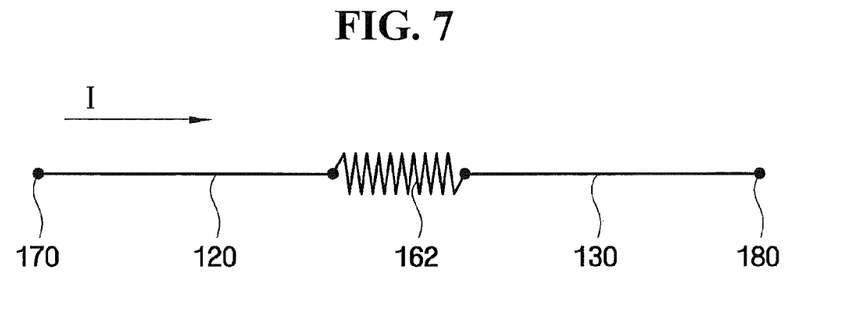
FIG. 7 is a circuit diagram of an e-fuse according to some embodiments of the present general inventive concept.
Figure 8:
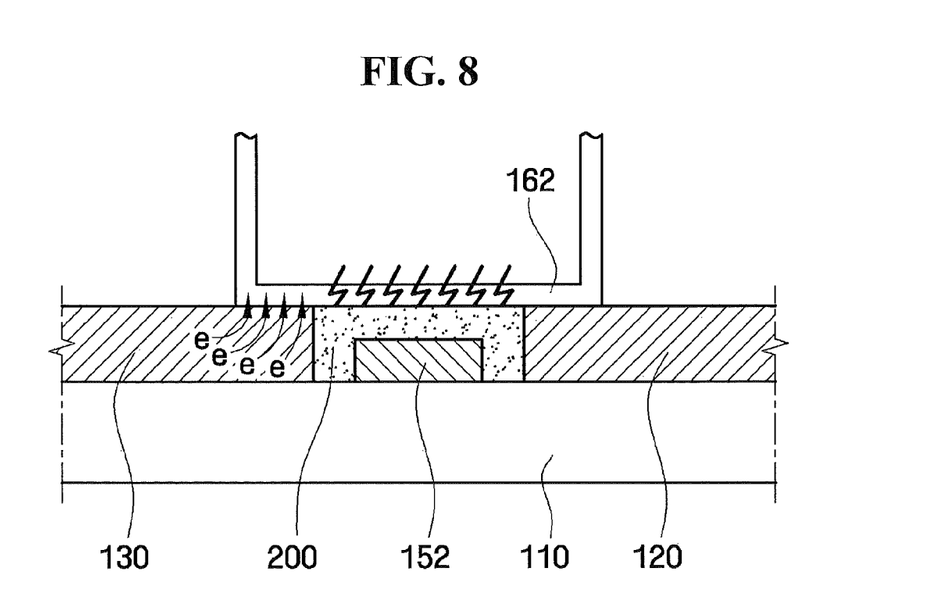
FIG. 8 is a diagram illustrating the operating principle of an e-fuse according to some embodiments of the present general inventive concept.
Figure 9:
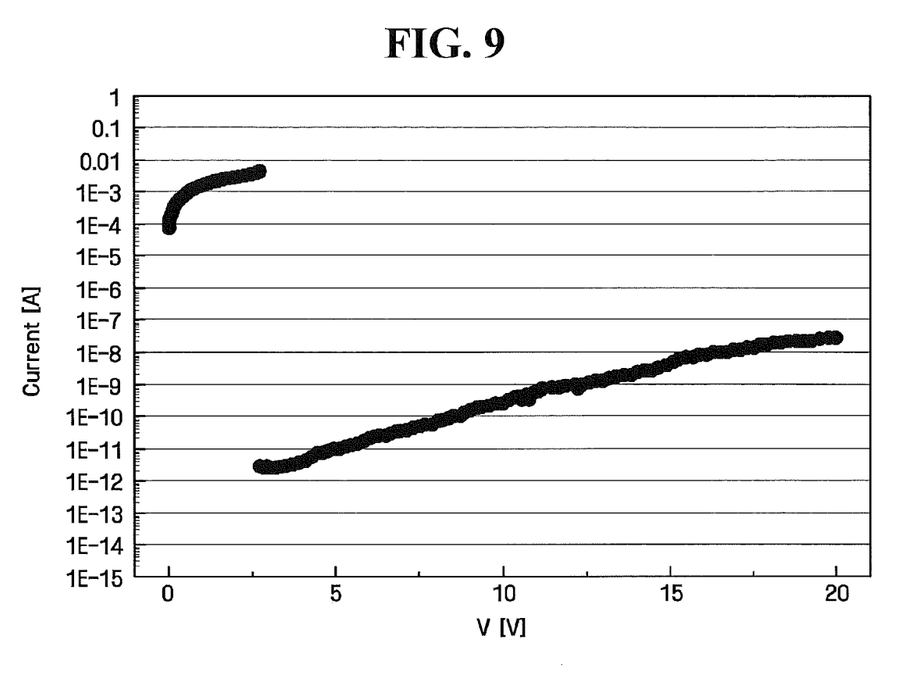
FIG. 9 is a diagram illustrating the results of experiments associated with an e-fuse according to embodiments of the present general inventive concept.

FIG. 7 is a circuit diagram of an e-fuse according to embodiments of the present general inventive concept, FIG. 8 is a diagram illustrating the operating principle of an e-fuse according to embodiments of the present general inventive concept, and FIG. 9 is a diagram illustrating the results of experiments associated with an e-fuse according to embodiments of the present general inventive concept.

Referring to FIG. 7, an input pad 170 may serve as an input terminal, and a first lower electrode pattern 120 may serve as a first conductive wire that connects the input terminal and a filament. The fuse conductive film pattern 162 that is relatively thin may serve as a filament, the second lower electrode pattern 130 may serve as a second conductive wire that connects the filament and the output terminal, and an output pad 180 may serve as an output terminal.

When an electrical potential is applied to the input pad 170 and the output pad 180, a current I flows from the input pad 170 to the output pad 180. As shown in FIG. 8, electrons (e) migrate from the second lower electrode pattern 130 to the first lower electrode pattern 120. Here, the fuse conductive film pattern 162 having low conductivity and a relatively small thickness may constitute a bottle neck of the conductive wire. When an electrical potential applied between the input pad 170 and the output pad 180 exceeds a predetermined level, a joule heat is generated at the fuse conductive film pattern 162 due to the bottle neck phenomenon of electro migration, and when the joule heat is continuously applied to the fuse conductive film pattern 162, the fuse conductive film pattern 162 may be cut. The cut fuse conductive film pattern 162 may naturally regrow according to the surrounding conditions changing after the cutting step. In the e-fuse according to the embodiments of the present general inventive concept, the fuse conductive film pattern 162 is formed to surround the moisture absorption preventing film 210, thereby preventing or inhibiting the re-growth phenomenon. Therefore, the reliability of the e-fuse according to the embodiments of the present general inventive concept can be considerably improved.

Since the first and second lower electrode patterns 120 and 130, the first and second etch stop patterns 152 and 154, e-fuse and the dummy conductive film patterns 162 and 164 may be formed using the same process as storage capacitors (not shown) formed in the cell array regions (CARs of FIG. 1), the e-fuse can be formed in a simplified manner without any additional process.

Specific experimental examples related to embodiments of the invention will now be described.

EXPERIMENTAL EXAMPLE

Referring to FIGS. 2 and 3, suppose the first and second lower electrode patterns 120 and 130 made of tungsten (W), the first etch stop pattern 152, and the fuse conductive film pattern 162 made of titanium nitride (TiN) have the following thicknesses listed in Table 1. An electric potential was applied to the input pad 170 and the output pad 180, and a current flowing between the input pad 170 and the output pad 180 was measured while slowly increasing the level of the electric potential.

TABLE 1

| | |
|---|---|
| Thicknesses of First and Second Lower Electrode Patterns (T2, T3) | 1,000 Å |
| Thickness of First Etch Stop Pattern | 500 Å |
| Thickness of Fuse Conductive Film Pattern (T1) | 80 Å |

FIG. 9 is a diagram illustrating the results of experiments associated with an e-fuse according to embodiments of the present general inventive concept.

As confirmed from FIG. 9, as the electric potential applied between the input pad 170 and the output pad 180 increased, the current flowing therebetween increased and abruptly decreased at the potential level of approximately 3 V. This is presumably caused because the fuse conductive film pattern 162 is cut due to a joule heat. Therefore, it can be concluded that the e-fuse according to the embodiments of the present general inventive concept properly function as a fuse. In addition, as shown in FIG. 9, once the fuse conductive film pattern 162 is cut, even if the voltage continuously increases, there is a considerable difference between the first current level and each of levels of continuously increasing current levels, suggesting that the e-fuse according to the embodiments of the present general inventive concept has useful characteristics as a fuse.

Next, electronic system as examples of using a semiconductor device including an e-fuse provided by methods of manufacturing a semiconductor device according to embodiments of the present general inventive concept will be described. In the following description, a memory IC device will be described by way of example of the semiconductor device according to an embodiment of the present general inventive concept, but the invention is not limited thereto.

Figure 10:
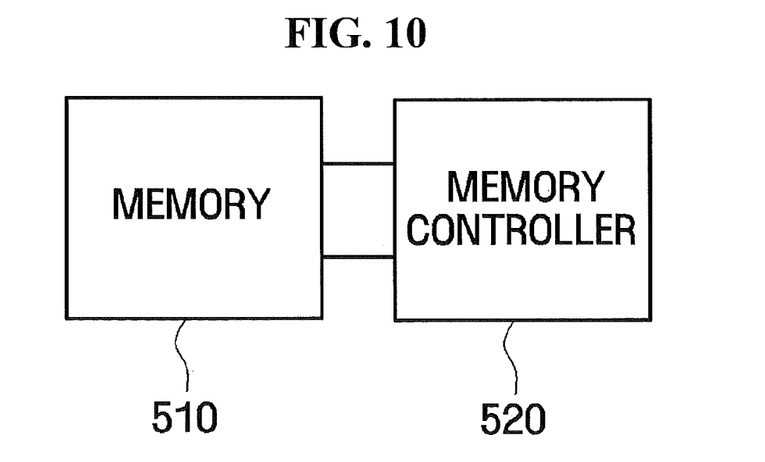
FIGS. 10 through 12 illustrate examples of using a semiconductor device provided by methods of manufacturing a semiconductor device according to embodiments of the present general inventive concept.
Figure 11:
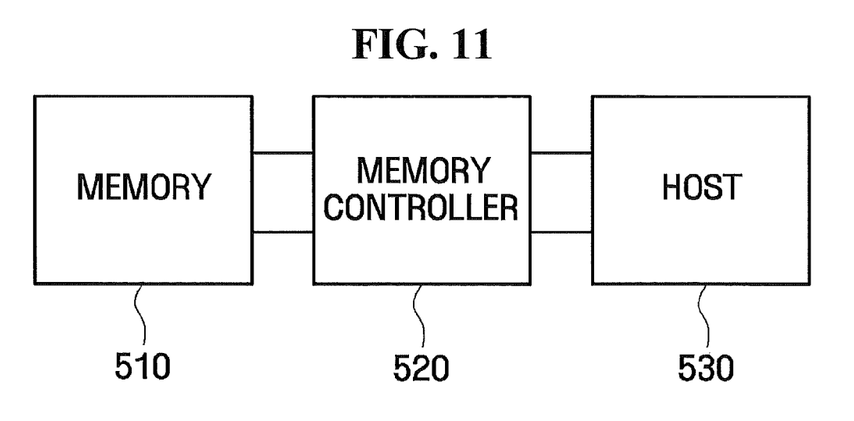
Figure 12:
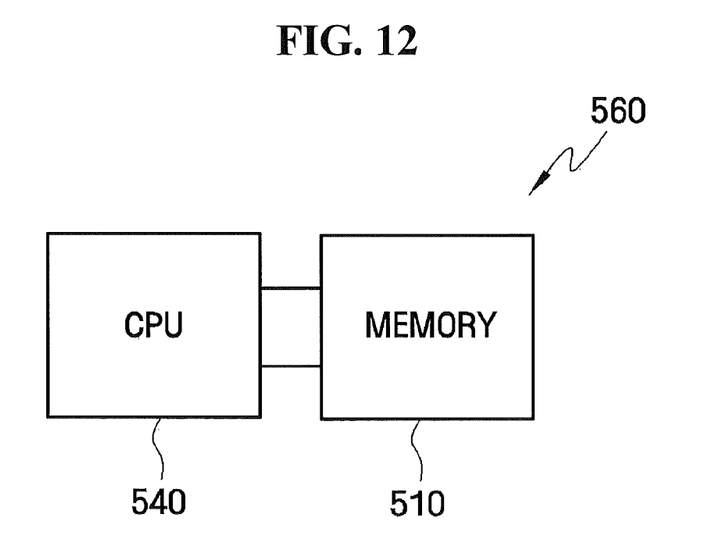

FIGS. 10 through 12 illustrate examples of using a semiconductor device provided by methods of manufacturing a semiconductor device according to embodiments of the present general inventive concept.

Referring to FIG. 10, a system according to an embodiment of the present general inventive concept includes a memory 510 and a memory controller 520 connected to the memory 510. The memory 510 is a semiconductor device manufactured according to the embodiments of the present general inventive concept. The memory controller 520 supplies an input signal for controlling the operation of the memory 510, such as an address signal and a command signal for controlling read and write operations, to the memory 510.

The system including the memory 510 and the memory controller 520 can be embodied in a card such as a memory card. More specifically, the system according to the embodiment of the present general inventive concept can be implemented as a card that is designed for use in electronic devices and meets a predetermined industry standard. Examples of such electronic devices may include mobile phones, two-way communication systems, one way pagers, two-way pagers, personal communication systems, portable computers, Personal Data Assistances (PDAs), audio and/or video players, digital and/or video cameras, navigation systems, and Global Positioning Systems (GPSs).

Referring to FIG. 11, a system according to another embodiment of the present general inventive concept includes a memory 510, a memory controller 520, and a host system 530. In this case, the host system 530 is connected to the memory controller 520 via a bus and supplies a control signal to the memory controller 520 that in turn controls the operation of the memory 510. The host system 530 may be a processing system designed for use in mobile phones, two-way communication systems, one way pagers, two-way pagers, personal communication systems, portable computers, personal data assistances (PDAs), audio and/or video players, digital and/or video cameras, navigation systems, and global positioning systems (GPSs).

While FIG. 11 shows that the memory controller 520 is interposed between the memory 510 and the host system 530, the system is not limited thereto. The system may not include the memory controller 520.

Referring to FIG. 12, a system according to another embodiment of the present general inventive concept may be a computer system 560 including a central processing unit (CPU) 540 and a memory 510. In the computer system 560, the memory 510 is connected directly or via a bus architecture to the CPU 540. The memory 510 also stores operation system (OS) instruction sets, basic input/output start up (BIOS) instruction sets, and advanced configuration and power interface (ACPI) instruction sets. The memory 510 can be used as a large-capacity storage device such as a solid state disk (SSD).

Although FIG. 12 shows only some of the components in the computer system 560 for convenience of explanation, the computer system 560 may have various other configurations. For example, while FIG. 12 shows the computer system 560 does not include the memory controller (520 in FIG. 11) between the memory 510 and the CPU 540, in another embodiment, the memory controller 520 may be interposed between the memory 510 and the CPU 540.

While the present general inventive concept has been particularly shown and described with reference to exemplary embodiments thereof, it will be understood by those of ordinary skill in the art that various changes in form and details may be made therein without departing from the spirit and scope of the present general inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A fuse structure, comprising:
   first and second electrodes extending in a first direction, the first and second electrodes having first ends thereof facing each other and spaced a predetermined distance apart from each other;
   an insulation layer between the first end of the first electrode and the first end of the second electrode; and
   a conductive film on the insulation layer and contacting portions of the first and second electrodes, wherein the conductive film electrically connects the first and second electrodes, and wherein the conductive film is configured to be physically cut when overheated by a joule heat generated at the conductive film.

2. The fuse structure of claim 1, further comprising a third electrode inside the insulation layer and extending in a second direction that is perpendicular to the first direction.

3. The fuse structure of claim 1, wherein a conductivity of the conductive film is lower than a conductivity of the first or second electrode.

4. The fuse structure of claim 3, wherein the conductive film includes a titanium nitride (TiN) film, and the first and second electrodes include a tungsten (W) or aluminum (Al) electrode.

5. The fuse structure of claim 1, wherein a thickness of the conductive film is smaller than a thickness of the first or second electrode.

6. The fuse structure of claim 5, wherein a ratio of the thickness of the conductive film to the thicknesses of the first and second electrodes is in a range of 1:50 to 1:10.

7. The fuse structure of claim 5, wherein the first electrode and the second electrode have the same thickness.

8. The fuse structure of claim 1, wherein the fuse structure is located in a fuse region of a substrate, and wherein the conductive film has a sectional profile that is the same as a sectional profile of a storage capacitor in a cell array region of the substrate.

9. The fuse structure of claim 1, further comprising a moisture absorption preventing film on the first electrode, the second electrode and the conductive film.

10. The fuse structure of claim 9, wherein the moisture absorption preventing film surrounds the conductive film.

11. An electronic fuse (e-fuse), comprising:
    a first lower electrode pattern on a substrate and extending in a first direction;
    a second lower electrode pattern on the substrate and extending in the first direction and spaced apart from the first lower electrode pattern in the first direction;
    a dummy electrode pattern extending in parallel with the first and second lower electrode patterns in the first direction;
    an insulation layer on the substrate between the first and second lower electrode patterns; and
    a conductive film on the insulation layer and contacting the first and second lower electrode patterns, wherein the conductive film electrically connects the first and second electrodes, and wherein the conductive film is configured to be physically cut when overheated by a joule heat generated at the conductive film.

12. The e-fuse of claim 11, further comprising a first etch stop pattern between the first and second lower electrode patterns spaced apart from each other on the substrate and extending in a second direction that is perpendicular to the first direction.

13. The e-fuse of claim 12, further comprising second etch stop patterns under the dummy electrode pattern and symmetrical to each other relative to the first and second lower electrode patterns and contacting the first etch stop pattern.

14. The e-fuse of claim 13, wherein the second etch stop patterns extend in parallel with each other in the second direction, the second etch stop patterns intersecting the dummy electrode pattern.

15. The e-fuse of claim 13, wherein the second etch stop patterns are plate-shaped.

16. The e-fuse of claim 11, further comprising dummy conductive film patterns on the dummy electrode pattern.

17. The e-fuse of claim 11, further comprising a moisture absorption preventing film on the fuse conductive film pattern and the dummy conductive film patterns.

18. The e-fuse of claim 11, wherein a conductivity of the fuse conductive film pattern is lower than a conductivity of the first and second electrodes.

19. The e-fuse of claim 18, wherein the fuse conductive film pattern includes a titanium nitride (TiN) film, and the first and second electrodes include a tungsten (W) or aluminum (Al) electrode.

20. A semiconductor device comprising:
    a substrate having cell array regions and a fuse region therein;
    a first lower electrode pattern on the fuse region of the substrate and extending in a first direction;
    a second lower electrode pattern on the fuse region of the substrate and extending in the first direction and spaced apart from the first lower electrode pattern in the first direction;
    a dummy electrode pattern extending in parallel with the first and second lower electrode patterns in the first direction;
    an insulation layer on the fuse region of the substrate between the first and second lower electrode patterns; and
    a fuse conductive film pattern on the insulation layer and contacting the first and second lower electrode patterns, wherein the fuse conductive film electrically connects the first and second lower electrode patterns, and wherein the conductive film is configured to be physically cut when overheated by a joule heat generated at the conductive film.

* * * * *